United States Patent [19]

Matsui, deceased et al.

[11] Patent Number: 5,164,792

[45] Date of Patent: Nov. 17, 1992

[54] MOVEMENT MEASURING INTERFEROMETER AND DRIVING SYSTEM

[75] Inventors: Yuji Matsui, deceased, late of Tokyo; by Michiko Matsui, legal representative, Saitama; Jun Nonaka, Tokyo, all of Japan

[73] Assignee: Asahi Kogaku Kogyo Kabushiki Kaisha, Tokyo, Japan

[21] Appl. No.: 554,850

[22] Filed: Jul. 20, 1990

[30] Foreign Application Priority Data

Jul. 20, 1989 [JP] Japan .................................. 1-185995

[51] Int. Cl.⁵ .............................................. G01B 9/02
[52] U.S. Cl. ................................................... 356/358
[58] Field of Search .............................. 356/358, 363

[56] References Cited

U.S. PATENT DOCUMENTS 4,643,577  2/1987  Röth et al. .......................... 356/358
4,814,625  3/1989  Yabu .................................... 356/358

Primary Examiner—Samuel A. Turner
Attorney, Agent, or Firm—Sandler, Greenblum & Bernstein

[57] ABSTRACT

A table carrier system of the present invention has a movable table for carrying an object. A displacement detecting system for detecting the displacement of the table by using an interference of light, and a table driving system positions the table according to the detected displacement. If a scaling amount is set in order to change a predetermined displacement range of the table, a reference value of wavelength set in the detecting system is changed in compliance with the scaling amount.

18 Claims, 2 Drawing Sheets

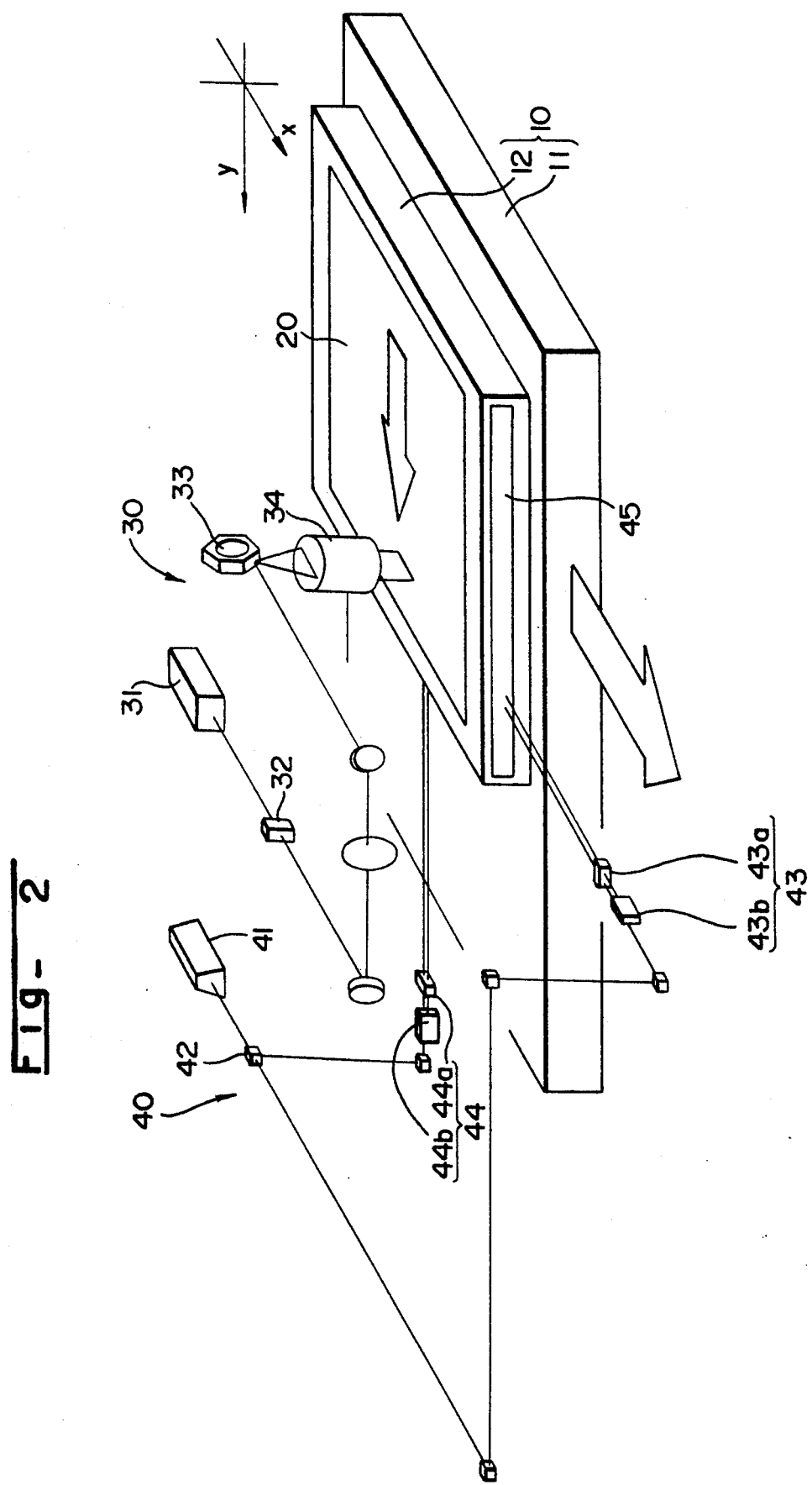

MOVEMENT MEASURING INTERFEROMETER AND DRIVING SYSTEM

BACKGROUND OF THE INVENTION

1. Field of the Invention

This invention relates to a table carrier system which drives a table, by measuring a moving amount of the table using an interference of a laser beam.

2. Background Description

Measuring systems used in this kind of tablet carrier system have a mirror mounted on the table and interferometers mounted as a static system. The interferometers emit measuring and reference light beams from one original source. The measuring light beam reflected by the mirror interferes with a reference light. The interferometers detect the interference between the two beams and output 1 pulse per $\lambda/n$ (usually $n=4$) change of distance between the interferometers and the mirror.

As counts of pulses are multiplied by value of $\lambda/n$ and the product is converted into units of inches or millimeters, the measuring system detects a moving amount of the table.

For example, a laser photo plotter, which has a scanning optical system for scanning the laser beam in a principal scanning direction and a table carrier system for carrying a table in an auxiliary scanning direction normal to the principal scanning direction, uses a method called "scaling" for controlling the table movement.

The process of scaling is used for changing an exposure area of the object such as a printed board from initialization in order to, for example, chemically process the printed board after being exposed. The method of scaling is used to increase or decrease a real moving amount, and not to change a set moving amount value, since a scale of a table driving system is changed otherwise.

Moreover, in order for the scanning optical system to produce scanning lines having equal or uniform pitch, it is necessary to distribute the increasing or decreasing part among all moving amount on an average. Heretofore, that distribution is achieved as a function of a software installed in a control unit for controlling and driving the table.

However, with the afore-mentioned table carrier system, detection of moving amount and control of driving system are executed independently, and a process of scaling is treated as a control of the driving system. Therefore, a minimum unit of the scaling is a unit of the driving system.

Generally, since the resolution of a driving system of a table carrier system is lower than that of position detecting systems, the conventional table carrier system carried out a high accuracy detection, but it could execute only rough accuracy scaling.

This problem can be solved by raising the resolution of the driving system to a value as high as that of the detecting system. However, in this case, a new problem occurs because a load for the driving system becomes larger and/or the software becomes complex.

SUMMARY OF THE INVENTION

The present invention has been accomplished in view of the above problem. It is therefore the object of the invention to provide a table carrier system with high accuracy error compensation with minimal driving system load and without the need for complex software.

A table carrier system of the present invention has a movable table for carrying an object. A moving amount detecting system detects an amount of movement or displacement of the table by using an interference of light, and a table driving system displaces the table in a certain direction, according to the detected moving amount. If a scaling value is set in order to change a predetermined whole moving amount (i.e., a displacement range of a table), a reference value of wavelength set in the detecting system is changed in compliance with the desired scaling value.

According to the above-mentioned construction, a value of laser wavelength used in measuring and controlling positioning of the movable table is corrected in accordance with an amount of scaling by use of a compensation factor, and the table carrier system is able to control the position of the table in accordance with a detected moving amount as determined in conjunction with the corrected value of wavelength.

BRIEF DESCRIPTION OF THE DRAWINGS

FIG. 2 is a schematic diagram showing a laser photo plotter in which the system of FIG. 1 is mounted.

DETAILED DESCRIPTION OF THE EMBODIMENTS

Figure 1:
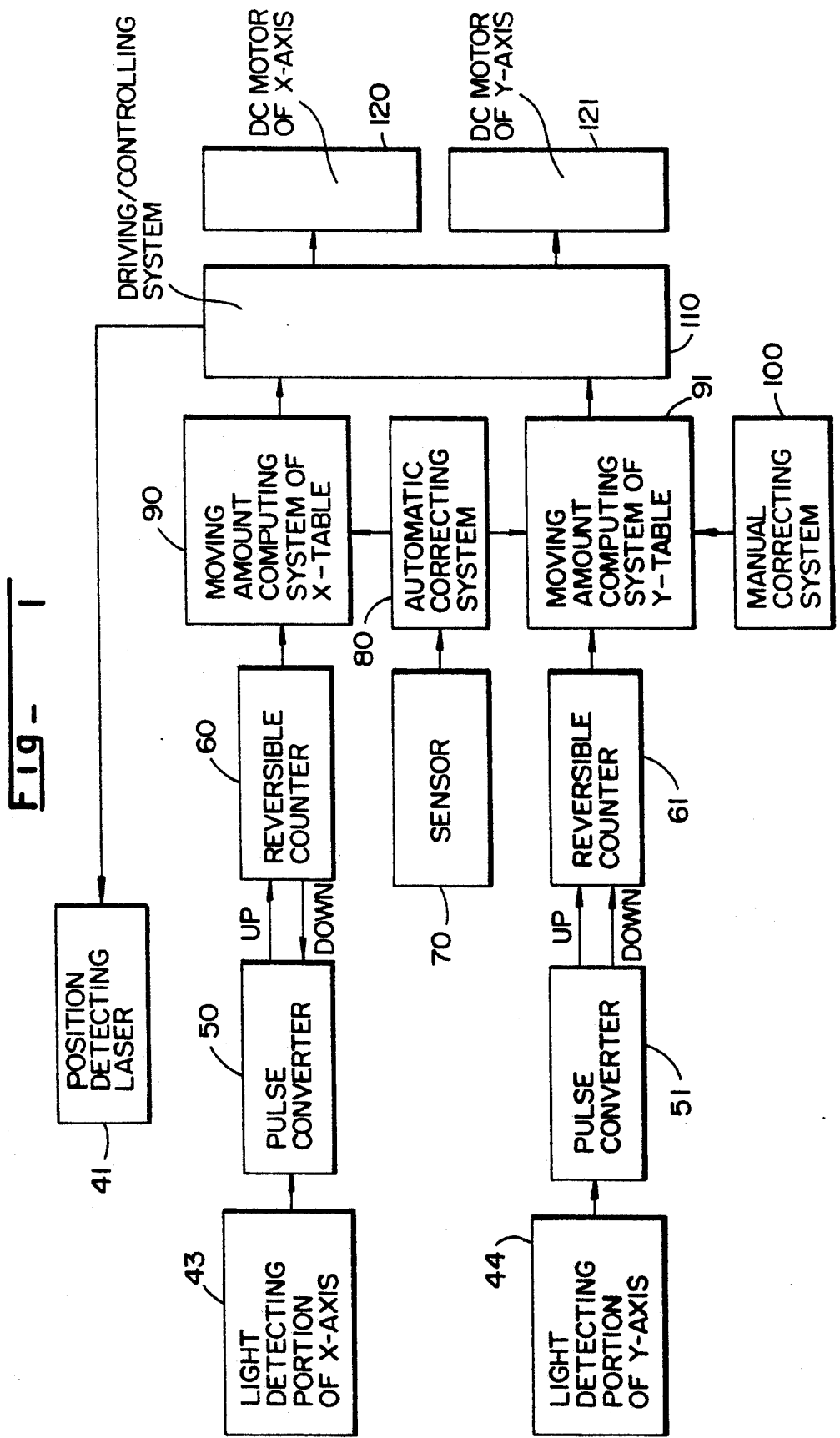
FIG. 1 is a block diagram showing one embodiment of a table carrier system according to the present invention.

An embodiment of the present invention will now be described hereinafter with reference to the drawings. This embodiment shows a laser photo plotter which draws a fine pattern onto a film or the like.

First, a general constructing of an optical and mechanical system will be described according to FIG. 2.

This plotter system generally comprises a table portion 10 which comprises an X-table 11 and a Y-table 12, a drawing optical system 30 which is located above the table portion 10 and exposes an object such as a film by scanning a laser beam, and a position detecting optical system 40 which detects positions of the tables.

The X-table 11 is slidably mounted on a base plate (not shown) as a static system, and the X-table 11 is driven by a DC motor via a ball screw.

The Y-table 12 is slidably mounted on the X-table 11. The Y-table 12 is driven by a DC motor via a ball screw and the Y-table 12 can be driven, in a direction normal to the motion of the X-table 11, along a guide rail located on the X-table 11.

A drawing optical system has a drawing laser 31, A0 (acousto-opic) modulator 32 which modulates a laser beam emitted from the drawing laser 31, a polygon mirror 33 which deflects the laser beam and an f$\Theta$ lens 34 which images the laser beam on a surface to be drawn. A whole moving amount refers to the movement of the Y-table from one extreme of its range of movement to its other extreme. When scaling is achieved, the measuring amount does not change, but an actual or real moving amount changes. Thus a predetermined whole moving amount refers to what the actual movement of the Y-table across its range of movement would be before scaling is performed.

In the system of this embodiment, the drawing surface is divided into a plurality of lanes in the principal scanning direction, and the drawing is performed along each lane. That is, the drawing surface is bi-axially driven by the table portion 10, the movement of the X-table allows transferring of lanes, and the movement of the Y-table allows axial scanning.

However, as this plotter system is fundamentally a raster type scanning system which uses an optical scanning system and table carrier system, this system is different from a vector scanning system. In this system, it is not necessary to drive the X-table 11 in both directions along the X-axis and Y-table 12 in both directions along the Y-axis. In the vector scanning system, both tables can be driven in both directions along each axis.

The driving direction of each table is one direction during the drawing so that a lost motion is removed. Therefore, in this plotter system, only Y-table 12 is object of the scaling.

A fundamental movement of this plotter system is as follows.

In a first lane of the surface to be scanned, the drawing optical system 30 makes the spot scan in the principal scanning direction, and the Y-table moves in the auxiliary scanning direction. After finishing the drawing of the first lane, the X-table 11 is moved so that a scope of scanning of the drawing optical system 30 is positioned on the second lane, and the Y-table 12 is driven in order to return to an initial position thereof. In the second lane and other lanes, the drawing optical system 30 and Y-table 12 are driven in the same manner as with for the first lane.

Position detecting optical system 40 comprises a position detecting laser 41, a half mirror prism 42 to divide the laser beam into two beams, a light detecting portion of X-axis 43, and a light detecting portion of Y-axis 44.

The light detecting portion of X-axis 43 provides an interferometer 43a and a light receiving element 43b. The interferometer 43a divides the laser beam from the laser 41 into a reference and measurement beams and makes the measurement beam, reflected by the mirror 45 fixed on the Y-table 12, interfere with the reference beam. The light receiving element 43b detects a quantity of interfered beam.

The light detecting portion of Y-axis 44 also similarly provides an interferometer 44a and a light receiving element 44b.

Next, a process of table control of the afore-mentioned photo plotter will be described.

The control system comprises, as shown in FIG. 1, light detecting portions of X-axis 43 and Y-axis 44, pulse converters 50, 51 which receive the output signals of light detecting portions 43, 44 and output pulses indicating the moving amount and the direction. Reversible counters 60, 61 are provided which receive up-down pulses from the pulse converters, and moving amount computing systems of X and Y axis 90, 91 are provided which compute the moving amount of the X and Y-Table on both of the output counts from the reversible counters 60, 61 and also the value of laser wavelength. A driving/controlling system 110 drives the DC motors 120, 121 of both axes, an automatic correcting system 80 corrects for the influence of change of atmosphere, and a manual correcting system 100 corrects for a motion of table according to a scaling amount. The value of wavelength is beforehand set in each moving amount computing system 90, 91. In this embodiment, a correcting system for atmosphere is referred to as the automatic correcting system, and a correcting system for scaling is referred to as the manual correcting system.

The signal of the automatic correcting system 80 is input to the moving amount computing systems of X and Y tables 90, 91. And the signal of the manual correcting system 100 is input to the moving amount computing system of Y-table 91. Both correcting systems are used for changing the value of wavelength set in each computing system.

Each moving amount computing system detects a moving amount to be based on that pulse counts. Therefore, if the value of wavelength is changed, a real moving amount changes even when the setting value of the whole moving amount does not change.

Next, the operation of the output of pulses will be described below.

Referring back to FIG. 2, the position detecting laser 41 emits a coherent light which includes two different frequency components of f1 and f2. One component is right circular polarized light and the other component is left circular polarized light. These components are converted into linear polarized lights by a $\lambda/2$ plate and $\lambda/4$ plate mounted in the laser 41. The laser beam from the laser 41 is divided into the two beams by the half mirror prism 42, and each beam is incident to the interferometers 43a, 44a. Each laser beam is divided into components f1 and f2 by a polarized beam splitter which is in the interferometers. The component of f1 is used as a measuring light and is guided to the mirror 45 which is mounted on the table. The component of f2 is used as a reference light which is interfered with the measuring light reflected from the mirror 45. As a result of the interference, a high frequency interference signal indicates a differential frequency between the beams which is generated.

When the mirror 45 moves, that is when the table moves, the frequency of the measuring light (which is f1) changes about f1 for the moving direction by the Doppler effect. Therefore, the frequency of the measuring light becomes (f1±Δf1). The light detecting portions 43b, 44b detect the interfered beam and output the interference signals which indicate the differential frequency {f2−(f1±Δf1)}.

Also, a differential frequency between f1 and f2 is also detected by an independent measuring means (not shown).

Next, each interference signal is input into an AC amplifier, and the differential frequency {f2−(f1±Δf1)} of the measuring beams and the differential frequency (f2−f1) of the reference beams are found. These differential signals are input into each of the pulse converters 50, 51 in order to get the frequency Δf. Each pulse converter outputs one pulse signal per $\lambda/4$ change of Δf.

The moving amount computing system 90, 91 detect a moving amount based on the number of pulses counted. The real moving amount or actual displacement of each table can be changed (or adjusted) so that the value of the set or setting moving amount is not changed, that is, so that it remains at a set value.

When the ambient atmospheric pressure and/or temperature changes, the refractive index of the air changes. For that reason, the light speed and the wavelength of laser light are also changed. And if the moving amount is detected based upon a measure of wavelength as mentioned above, the standard of measuring is changed. Therefore, the moving amount detecting system corrects the value of wavelength using pressure and temperature as a compensation factor in order to correct influences by changes in atmosphere. Correction of the wavelength does not mean to change the wavelengths of laser, f1, f2. This word means to change the value of wavelength which is set in each of the moving amount computing systems 90, 91.

The automatic correcting system 80 sets a compensation factor $\alpha$ based on the change of atmosphere input from a sensor 70.

Also, the automatic correcting system 80 is provided to compensate for changes in the value of laser wavelength in order to correct the unit of measuring. The value of $\alpha$ (a scaling or compensation factor) is calculated based on a predetermined table or formula. This correcting system 80 operates a compensation factor $\alpha$ and supplies it to each table moving amount computing system 90, 91.

The automatic correcting system 80 is also able to correct for an influence of thermal expansion in addition to the correction for the change of light speed. In general, as all dimensions are defined in 20° C., if temperature is different from 20° C., a length of that part becomes bigger or smaller depending on whether a coefficient of thermal expansion of the part is positive or negative. Automatic correcting system 80 has a sensor of a heating value, and the coefficient of thermal expansion is input by a switch of the apparatus. The automatic correcting system 80 computes the demanded operation and changes the compensation factor $\alpha$ based on the result of this operation.

The manual correcting system is also provided to change the value of laser wavelength in order to correct the unit of measuring. The manual correcting system 100 sets a compensation factor $\beta$ based on a desired amount of scaling. The value of $\beta$ is calculated based on the amount of the scaling and the amount of whole moving amount (or table moving range). This correcting system calculates the compensation factor $\beta$ and supplies it to the moving amount computing system of Y-table 91.

Now, a concrete example of scaling will be described.

If a predetermined whole moving amount (i.e., the total displacement range) $L\phi$ is 1 meter (1,000,000 $\mu$m) and the value of $\lambda/4$ (before correcting) is 0.158 $\mu$m, the number of pulses (PC) for the whole moving amount is 6,329,113. And now, the scaling amount L1 is set as, for example, 0.01 meter (10,000 $\mu$m), the actual whole moving amount is 230.99 meter. When the value of $\lambda/4$ does not change, the amount of counted pulses PC is 6,265,822. However, the count of pulses PC should not change even if scaling is achieved. Therefore, in order to hold the count of pulses PC, the correcting factor $\beta$ is necessary. The factor $\beta$ is derived as follows;

$$\beta = (L\phi - L1)/L\phi$$

In this example $\beta$ is 0.99. And since the value of $\lambda/4$ is corrected by the factor $\beta$, $\lambda/4$ is 0.15642 $\mu$m and the count of pulses is 6,329,113. Accordingly, the real moving amount changes even though the count of pulses PC does not.

The moving amount computing system of the X-table 90 determines an amount of motion of the X-table to multiply the Value of $\lambda/4$ under a vacuum (for example 0.15824785 $\mu$m in case a He Ne laser is used) by compensation factor $\alpha$ and a count of pulses PC as follows:

$$X = K \times \lambda \times \alpha \times PC$$

$$k = \tfrac{1}{4}$$

The moving amount computing portion of the Y-table 91 multiplies the value of $\lambda/4$ under a vacuum by compensation factor $\alpha$, $\beta$ and PC, and the product is the moving amount Y as follows;

$$Y = k \times \lambda \times \alpha \times \beta \times PC$$

$$k = \tfrac{1}{4}$$

By the above function of the system, the moving amount of the X-table is detected including the correcting value of the change of the atmosphere, and the moving amount of the Y-table is detected including the correcting value of the change of the atmosphere and the correcting value of the scaling.

The driving/controlling portion 110 recognized the detected moving amount as the real moving amount, and controls DC motors 120, 121 of each axis until the detected moving amount coincides with an initialized whole moving amount.

On the above construction, high accuracy scaling of the position detecting system can be achieved. Also, as the detected moving amount already includes the correcting amount of the scaling, it is not necessary to treat the scaling with software.

In the above embodiment, the method of scaling is applied in Y-axis direction, but it may be applied in both axis directions.

Moreover, though the plotter system of the above embodiment has the automatic correcting system 80 for correcting for changes of the atmosphere, it is not indispensable for the present invention. If the plotter system is used in a room in which changes of atmosphere are small, it is enough to only provide the manual correcting system.

Furthermore, in above embodiment, the position detecting system uses the change of frequency for getting the moving amount. However, this invention can be applied to other detecting systems, for example, a system to use the change of light path length.

What is claim is:

1. A table carrier system comprising: a movable table for carrying an object;

means for detecting the displacement of said table by using an interference of light in accordance with a reference value which corresponds to a wavelength of said light;

table driving means for positioning said table in accordance with the detected displacement of said table;

means for setting a scaling amount in order to change a predetermined displacement range of said table; and means for changing said reference value in compliance with said scaling amount.

2. A table carrier system according to claim 1, wherein said detecting means comprises:

means for emitting a light beam;

means for dividing said light beam into a measuring beam and reference beam;

a mirror which is fixed on said table and reflects said measuring beam;

interference means which make said measuring beam reflected by said mirror interfere with said reference beam;

means for receiving the interfered beam and outputting a signal representing said interfered beam;

means for outputting pulses according to the output of said receiving means;

means for computing said displacement "X" of said table according to the relation $$X = k \times \lambda \times PC \times \beta.$$

where
K is a constant,
λ is the wavelength of a component of said light;
PC is the count of pulses output by said pulse outputting means, and
β is a compensation factor for said scaling amount.

3. A table carrier system according to claim 2, wherein said compensation factor β is given by the relation $$\beta = (L0 - L1)/L0,$$

where
L0 is the displacement range of said table, and
L1 is the amount of scaling, 4. A table carrier system according to claim 1, wherein said table comprises an X-table and a Y-table which are respectively movable in two directions normal to each other, said driving means drives said tables in said two directions, said detecting means detects the displacement amount of the X-table and the Y-table, and said scaling setting means sets a scaling amount for at least one direction.

5. A table carrier system according to claim 4, wherein said scaling setting means can set the scaling amount of one of said normal directions.

6. A table carrier system according to claim 1, further comprising:
means for setting a correcting factor which corrects for an influence of change of atmosphere; and
means for changing said reference value based on said correcting factor.

7. A photo plotter system comprising:
a scanning optical system which makes a spot scan on an object;
a table for carrying said object in a direction normal to the scanning direction of said spot;
means for detecting a displacement of said table by using an interference of light in accordance with a reference value which corresponds to a wavelength of said light;
table driving means which positions said table in accordance with the detected displacement of said table; and
means for setting a scaling amount in order to change a predetermined displacement range of said table;
means for changing said reference value in compliance with said scaling amount.

8. A photo plotter system according to claim 7, wherein said detecting means comprises:
means for emitting a light beam;
means for dividing said light beam into a measuring beam and reference beam;
a mirror which is fixed on said table and reflects said measuring beam;
interference means which makes said measuring beam reflected by said mirror interfere with said reference beam;
means for receiving the interfered beam and outputting a signal representing said interfered beam;

means for outputting pulses according to the output of said receiving means;

means for computing said displacement "X" of said table according to the relation $$X = k \times \lambda \times PC \times \beta.$$

where
k is a coefficient,
λ is the wavelength of a component of said light,
PC represents a pulse count, and
β is a compensation factor set based on said scaling amount.

9. A photo plotter system according to claim 8, wherein said compensation factor β is given by the relation $$\beta = (L0 - L1)/L0,$$

where
L0 is the displacement range of said table, and
L1 is the amount of scaling, 10. A photo plotter system according to claim 7, wherein said table comprises an X-table and a Y-table which are respectively movable in two directions normal to each other, said driving means drives said tables in said two directions, said detecting means detects the displacement of the X-table and the Y-table, and said scaling setting means sets a scaling amount for at least one direction.

11. A photo plotter system according to claim 10, wherein said scaling setting means sets the scaling amount of one of said tables.

12. A photo plotter system according to claim 7, further comprising:
means for setting a correcting factor which corrects an influence of change of atmosphere;
means for said value of wavelength based on said correcting factor.

13. A displacement measurement and driving system, said system comprising:
means for producing a measurement value indicative of the displacement between two members, said two members having a predetermined displacement range, said means for producing haveing a limited resolution capability for producing said measurement value;
means for driving at least one of said two members as a function of the measurement value produced by said means for producing;
means for adjusting said predetermined displacement range to define an adjusted displacement range;
means for scaling said measurement value so that said adjusted displacement range utilizes the full resolution of said means for producing a measurement value.

14. The displacement measurement and driving system according to claim 13, said two members comprising a base plate and at least one table, respectively.

15. The displacement measurement and driving system according to claim 14, wherein said at least one table comprises an X-table and a Y-table, said X-table being adapted to move along a first direction and said Y-table being adapted to move along a second direction orthogonal to said first direction.

16. The displacement measurement and driving system according to claim 13, said means for producing a measurement value comprising an optical distance measurement system, said optical distance measurement system setting a reference value corresponding to a wavelength of light used to perform distance measurement, and utilizing said reference value to calculate said measurement value.

17. The displacement measurement and driving system according to claim 16, said scaling means comprising means for changing said reference value which is used to calculate said measurement value by said optical distance measuring system.

18. The displacement measurement and driving system according to claim 17, further comprising means for setting a correcting factor which corrects for an influence of change of atmosphere, and means for changing said reference value as a function of said correcting factor.

* * * * *